United States Patent
Machida et al.

(10) Patent No.: US 7,825,435 B2
(45) Date of Patent: Nov. 2, 2010

(54) DIODE-LIKE COMPOSITE SEMICONDUCTOR DEVICE

(75) Inventors: Osamu Machida, Saitama (JP); Akio Iwabuchi, Saitama (JP)

(73) Assignee: Sanken Electric Co., Ltd. (JP)

( * ) Notice: Subject to any disclaimer, the term of this patent is extended or adjusted under 35 U.S.C. 154(b) by 242 days.

(21) Appl. No.: 12/015,067

(22) Filed: Jan. 16, 2008

(65) Prior Publication Data
US 2008/0191216 A1 Aug. 14, 2008

(30) Foreign Application Priority Data
Feb. 9, 2007 (JP) ............................. 2007-031103

(51) Int. Cl.
*H01L 29/80* (2006.01)
(52) U.S. Cl. .................. 257/195; 257/76; 257/E27.016; 257/E29.1
(58) Field of Classification Search ......... 257/254–355, 257/373
See application file for complete search history.

(56) References Cited

U.S. PATENT DOCUMENTS
2006/0081897 A1* 4/2006 Yoshida ....................... 257/289

FOREIGN PATENT DOCUMENTS

| JP | 2001332747 | 11/2001 |
| JP | 2004022639 | 1/2004 |
| JP | 2005235985 | 9/2005 |

* cited by examiner

*Primary Examiner*—Fernando L Toledo
*Assistant Examiner*—Mamadou Diallo
(74) *Attorney, Agent, or Firm*—Woodcock Washburn LLP

(57) ABSTRACT

A silicon-made low-forward-voltage Schottky barrier diode is serially combined with a high-antivoltage-strength high-electron-mobility transistor made from a nitride semiconductor that is wider in bandgap than silicon. The Schottky barrier diode has its anode connected to the gate, and its cathode to the source, of the HEMT. This HEMT is normally on. The reverse voltage withstanding capability of the complete device depends upon that between the drain and gate of the HEMT.

13 Claims, 10 Drawing Sheets (A)

(B)

(A)

(B)

DIODE-LIKE COMPOSITE SEMICONDUCTOR DEVICE

CROSS REFERENCE TO RELATED APPLICATIONS

This application claims priority to Japanese Patent Application No. 2007-031103, filed Feb. 9, 2007.

BACKGROUND OF THE INVENTION

This invention relates to composite semiconductor devices, particularly to one integrally comprising a semiconductor rectifier and unipolar field effect transistor, altogether functioning as diode. More particularly, the invention is directed to such a diode-like semiconductor device which has an improved recovery time, antivoltage strength, and forward voltage requirement.

Inverters (DC-to-AC converters) and switching-mode power supplies are alike in incorporating a switching device that rapidly turns on and off. The voltage applied to the switching devices for their on-off control is so high that the diodes put to combined use therewith must necessarily have a correspondingly high antivoltage strength and short reverse recovery time. These requirements are met to some extent by the known silicon pin (p-type/intrinsic/n-type) diode, or fast recovery diode (FRD) in more common parlance. But even the FRD is not exactly zero in recovery time, and silicon FRDs capable of withstanding voltages up to 600 volts, for instance, necessitate a relatively high forward voltage (curve C in the graph of FIG. 4A).

The Schottky barrier diode (SBD) is also known which has no reverse recovery time due to minority carrier storage. A low-antivoltage-strength silicon SBD requires a relatively low forward voltage (curve B in FIG. 4A) but is incapable of withstanding as high a voltage as required in the applications now under consideration.

Japanese Unexamined Patent Publication No. 2004-22639 suggests gallium nitride (GaN) and silicon carbide (SiC) SBDs which are both capable of withstanding voltages up to 600 volts or so. This advantage is offset, however, by their high forward voltage requirements (curve D in FIG. 4A). It might be contemplated to design these SBDs for a low forward voltage drop, but then they would also in inconveniently low in withstanding capability due to a rise in current leakage in response to a reverse voltage.

SUMMARY OF THE INVENTION

The present invention has it as an object to provide a composite semiconductor device that is capable of a rectifying function and that is improved in all of forward voltage drop, voltage withstanding capability, and reverse recovery time.

Briefly, the invention may be summarized as a composite semiconductor device in the form of a combination of a semiconductor rectifier and a unipolar field effect transistor. The semiconductor rectifier has a first and a second electrode. The unipolar field effect transistor comprises a first main electrode coupled to the second electrode of the semiconductor rectifier, a second main electrode, and a gate electrode coupled to the first electrode of the semiconductor rectifier. The unipolar field effect transistor is adapted to turn on when a voltage is impressed between the first electrode of the semiconductor rectifier and the second main electrode of the field effect transistor in a direction to forward bias the semiconductor rectifier. A current flowing between the gate electrode and the second main electrode of the field effect transistor when the field effect transistor is on is less than a current flowing between the first and the second electrode of the semiconductor rectifier. A voltage withstanding capability between the second main electrode and the gate electrode of the field effect transistor is higher than that of the semiconductor rectifier when a voltage is impressed between the first electrode of the semiconductor rectifier and the second main electrode of the field effect transistor.

Preferably, the semiconductor rectifier of the above summarized composite semiconductor device may be either a silicon pin-junction diode, silicon pn-junction diode, or silicon Schottky barrier diode of less voltage withstanding capability than those of known compound semiconductor diodes. The field effect transistor on the other hand may be selected from among a high electron mobility transistor, metal semiconductor field effect transistor, insulated gate field effect transistor, junction gate field effect transistor, and static injunction transistor.

Connected in series with the semiconductor rectifier as proposed by this invention, the unipolar field effect transistor is on when the semiconductor rectifier is forward biased. When the semiconductor rectifier is forward biased, and the field effect transistor is therefore on, the current flowing between the gate electrode and second main electrode (e.g., drain) of the field effect transistor is less than the current (forward current) flowing between the first and the second electrode of the semiconductor rectifier. As a result, all or most of the current flowing between the first electrode of the semiconductor rectifier and the second main electrode of the field effect transistor does so through the semiconductor rectifier instead of through the gate electrode.

In unipolar field effect transistors in general, as the name implies, only electrons or holes rather than both are utilized for conduction. Minority carriers are therefore nonexistent in unipolar devices, so that there arises no problem of turn-off delay due to the storage of minority carriers. When reverse biased by a voltage applied between the second main electrode (e.g., drain) and the first electrode (e.g., anode) of the semiconductor rectifier, the semiconductor rectifier remains reverse biased until the field effect transistor turns off. However, in cases where the semiconductor rectifier is a silicon Schottky barrier diode, which is known as a "majority carrier semiconductor device," there is no reverse recovery time. Turn-off response delay is negligible.

Reverse recovery time does exist, and so does turn-off response delay, in cases where a pn-junction diode is employed as the semiconductor rectifier. But the reverse recovery time and resulting turn-off response delay are reducible by making the voltage withstanding capability of the pn-junction diode less than that between the gate and second main electrode of the unipolar field effect transistor. As is well known, when the pn-junction diode is low in antivoltage strength, the impurity concentrations of the semiconductor regions are higher, the lifetime of the minority carriers is shorter, and the reverse recovery time is also shorter. Thus the composite semiconductor device of the instant invention, as defined in the foregoing summary, functions as high speed diode.

All the voltage applied to this composite semiconductor device is impressed between the second main electrode and gate of the field effect transistor when this transistor is off. The antivoltage strength of the device depends therefore on the voltage withstanding capability between the second main electrode and gate of the field effect transistor. The semiconductor rectifier itself need not be particularly high in antivoltage strength. As is well known, a semiconductor rectifier of low antivoltage strength is also low in forward voltage drop, hence in power loss, and moreover is reducible in size. The composite semiconductor device as a whole is less in forward voltage requirement than the prior art GaN or SiC SBDs of high antivoltage strength that are wider in bandgap. Thus does the instant invention succeed in the provision of a diode-like composite semiconductor device of low forward voltage, high antivoltage strength, and high speed operation.

An additional advantage of the invention arises from the fact that the semiconductor rectifier and unipolar field effect transistor comprising the device of this invention are so made that the current flowing between the gate and second main electrode of the field effect transistor when this transistor is on is less then the current flowing between the first and the second electrode of the semiconductor rectifier. Consequently, the forward current of the device flows predominantly through the rectifier, hardly through the gate of the field effect transistor. The gate of the field effect transistor can therefore be of minimal current capacity.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

Figure 1:
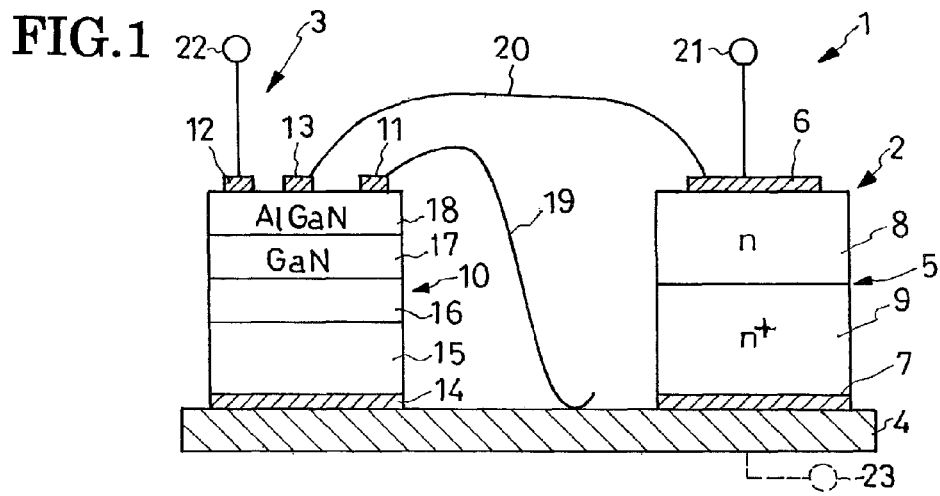
FIG. 1 is a schematic diagram of a first preferred form of composite semiconductor device according to the novel concepts of this invention, incorporating a silicon SBD as a semiconductor rectifier and a high electron mobility transistor as a unipolar field effect transistor.

The diode-like composite semiconductor device according to the present invention will now be described more specifically in terms of its first preferred form illustrated in FIG. 1 and therein generally designated 1. Broadly, the representative composite semiconductor device 1 comprises a silicon (Si) SBD 2 and a unipolar field effect transistor in the form of a high electron mobility transistor (HEMT) 3. Both Si SBD 2 and HEMT 3 are mounted side by side on a baseplate 4.

The Si SBD 2 of the composite semiconductor device 1 has a body 5 of doped silicon with an anode or Schottky electrode (first electrode) 6 and cathode (second electrode) 7 arranged opposite each other across the silicon body. The silicon body 5 is doped to provide an n-type semiconductor region 8 and $n^+$-type semiconductor region 9 which are contiguous to each other. The anode or Schottky electrode 6 is made from a metal such as tungsten, palladium or molybdenum and makes so-called Schottky contact with the n-type region 8 of the silicon body 5. The cathode 7 on the other hand makes ohmic contact with the $n^+$-type region 9. Made from copper or like metal that is both a good electric conductor and heat radiator, the baseplate 4 is connected to the cathode 7 both mechanically and electrically via a layer, not shown, of an electroconductive bonding agent.

The HEMT 3 of the composite semiconductor device 1 includes a multilayered semiconductor body 10 having formed in selected positions on its top a source electrode (first main electrode) 11, a drain electrode (second main electrode) 12, and a gate electrode 13. A back electrode 14 underlies the semiconductor body 10. In use of the HEMT 3 the electric current may flow either from drain electrode 12 to source electrode 11 or vice versa. Therefore, as used herein and in the claims appended hereto, the generic terms "first main electrode" and "second main electrode" should be construed to refer each to either source electrode 11 or drain electrode 12.

The semiconductor body 10 of the HEMT 3 includes a flat silicon substrate 15 on which there are successively formed a buffer layer 16, an electron transit layer 17 of gallium nitride (GaN), and an electron supply layer 18 of aluminum gallium nitride (AlGaN). The source electrode 11 and drain electrode 12 make ohmic contact with the electron supply layer 18 which constitutes the topmost layer of the semiconductor body 10. Interposed between these source electrode 11 and drain electrode 12, the gate electrode 13 makes Schottky contact with the electron supply layer 18.

As the GaN electron transit layer 17 and AlGaN electron supply layer 18 of the semiconductor body 10 provide a hetero-junction, a two-dimensional electron (carrier) gas layer is conventionally created by piezoelectric depolarization in the neighborhood of that junction thereby providing a channel. The two-dimensional electron gas layer does not require an application of a bias voltage to the gate electrode 13, so that the HEMT 3 is normally on. That is to say that conduction occurs between source electrode 11 and drain electrode 12 of the HEMT 3 upon voltage application therebetween, with the gate electrode 13 left unbiased.

The back electrode 14 under the silicon substrate 15 is affixed to the metal-made baseplate 4 via a layer, not shown, of an electroconductive bonding agent. The source electrode 11 atop the semiconductor body 10 is also electrically coupled to the baseplate 4 via a conductor 19, so that the cathode 7 of the Si SBD 2 is connected to the source electrode 11 of the HEMT 3 via the baseplate 4 and conductor 19. The gate electrode 13 of the HEMT 3 is connected to the Schottky electrode 6 of the Si SBD 2 via another conductor 20.

The composite semiconductor device 1 is furnished with a first or positive terminal 21 coupled to the Schottky electrode 6 of the Si SBD 2 and a second or negative terminal 22 coupled to the drain electrode 12 of the HEMT 3. The composite semiconductor device 1 as a whole functions as a rectifying diode.

Figure 2:
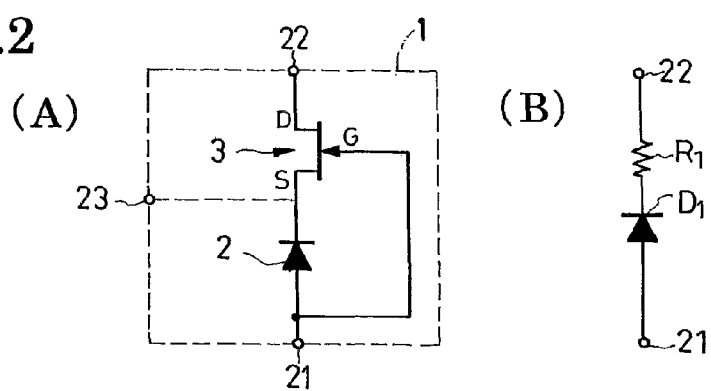
FIG. 2 diagrammatically illustrates at (A) the electric circuitry of the composite semiconductor device of FIG. 1 and at (B) an equivalent electric circuit of the device when the semiconductor rectifier included therein is forward biased.

As diagramed at (A) in FIG. 2, the composite semiconductor device 1 is electrically equivalent to a serial connection of a semiconductor rectifier in the form of the Si SBD 2 and a normally-on field effect transistor in the form of the HEMT 3, with the gate G of the HEMT 3 connected to the first terminal 21. The gate-source voltage $V_{gs}$ of the normally-on HEMT 3 is correlated to the source current $I_s$ as in the graph (B) in FIG. 4. Consequently, the HEMT 3 is on when its gate-source voltage $V_{gs}$ is higher than a predefined threshold $V_{th}$, and off when the gate-source voltage $V_{gs}$ is less than the threshold $V_{th}$.

The Si SBD 2 is forward biased when the first terminal 21 is higher in potential than the second 22. As the forward voltage $V_f$ of the Si SBD 2 is applied between the gate G and source S of the HEMT 3, the latter conducts, with consequent flow of source current $I_s$ at a rate corresponding to the forward voltage $V_f$ of the SBD. The path of the current flow at this time is comprised of the first terminal 21, Si SBD 2, HEMT 3, and second terminal 22.

When the Si SBD 2 is forward biased, the terminals 21 and 22 of the composite semiconductor device 1 may be thought of as being equivalently interconnected via an ideal diode $D_1$ and resistor $R_1$. If the equivalent diode $D_1$ is not an ideal one but has some internal resistance, then the equivalent resistor $R_1$ may be considered to represent the inherent resistance between source S and drain D of the HEMT 3.

Figure 3:
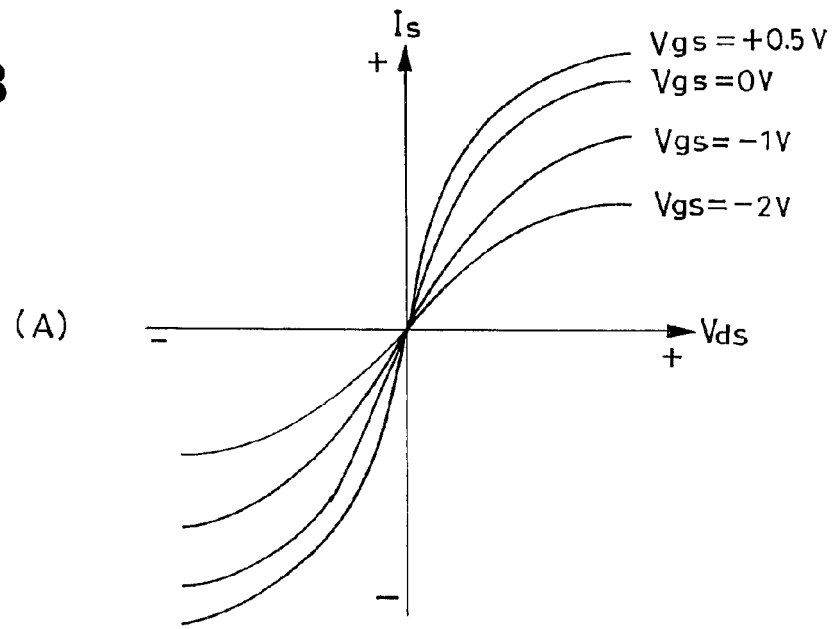
FIG. 3 graphically indicates at (A) the relationships between the drain-source voltage and source current of the high electron mobility transistor of the composite semiconductor device of FIG. 1 in the absence of the silicon SBD and at (B) the relationships between the gate source voltage and source current of the high electron mobility transistor at various drain-source voltage values.
Figure 3:
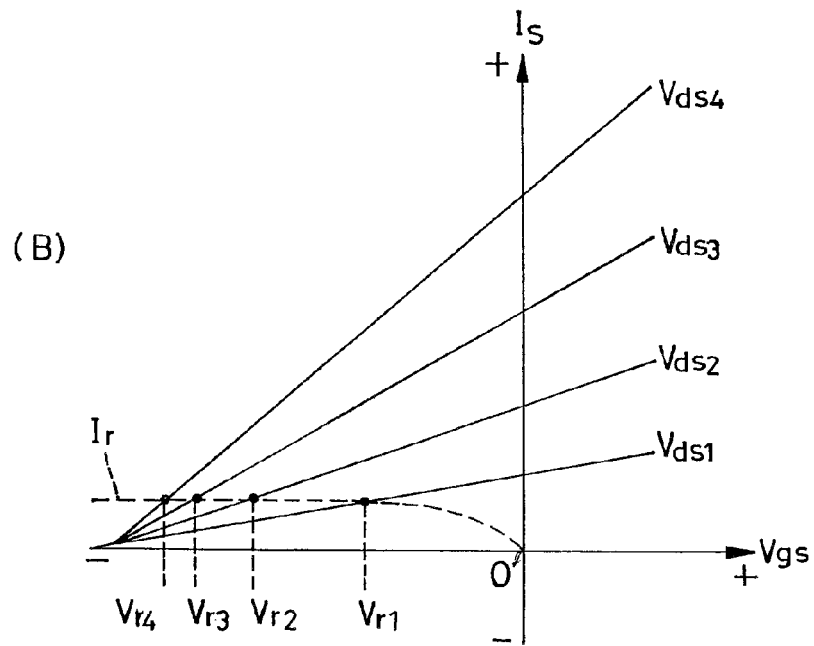

At (A) in FIG. 3 are plotted the correlations between the drain-source voltage $V_{ds}$ and source current $I_s$ of the HEMT 3 in the absence of the Si SBD 2. As is apparent from this graph, were it not for the Si SBD 2 contrary to the teachings of the instant invention, the source current and drain current of the HEMT would flow when the device was driven both forwardly (drain D higher in potential than the source S) and reversely (drain D less in potential than the source S). Contrastively, according to the present invention, the Si SBD 2 is connected between the source S of the HEMT 3 and the first terminal 21, so that the HEMT is off when its drain D is higher in potential than the source S, and on only during reverse driving when the drain D is less in potential than the source S.

This subject merits further elaboration: The Si SBD 2 is reverse biased when the second terminal 22 grows higher in potential than the first 21, with the consequent application of the reverse voltage $V_r$ of the Si SBD between the gate G and source S of the HEMT 3 as the gate-source voltage $V_{gs}$. Between the drain and source of the HEMT 3, on the other hand, there is applied a voltage equal to the potential difference between the terminals 21 and 22 minus the absolute value of the reverse voltage $V_r$ of the Si SBD 2. Since the threshold voltage $V_{th}$ of the HEMT 3 is set lower than the maximum voltage to be withstood by the Si SBD 2, that is, its peak reverse voltage, the HEMT turns off before the Si SBD breaks down.

As graphically represented at (B) in FIG. 3, the HEMT 3 has its source current $I_s$ changed with the drain-source voltage $V_{ds}$ even though the gate-source voltage $V_{gs}$ remains the same. This graph indicates correlations between gate-source voltage $V_{gs}$ and source current $I_s$ at four different values $V_{ds1}$, $V_{ds2}$, $V_{ds3}$ and $V_{ds4}$ of the drain-source voltage $V_{ds}$. The broken line in the graph represents the leakage current $I_r$ of the Si SBD 2.

When the second terminal 22, FIGS. 1 and 2, of the composite semiconductor device 1 is progressively made higher in potential than the first terminal 21, the Si SBD 2 is correspondingly reverse biased, with the consequent flow of reverse current $I_r$ as indicated by the broken line in the graph (B) of FIG. 3. The source current $I_s$ of the HEMT 3 increases with the drain-source voltage $V_{ds}$. Therefore, as is apparent from the graph (B) in FIG. 3, the reverse voltage $V_r$ of the Si SBD 2 rises with the drain-source voltage $V_{ds}$ of the HEMT 3. The HEMT 3 goes off when the reverse voltage $V_r$ of the Si SBD 2 reaches the threshold voltage $V_{th}$ of the HEMT 3 because the reverse voltage $V_r$ of the Si SBD 2 is impressed between the gate G and source S of the HEMT 3.

It is to be noted that no voltage higher than the threshold voltage $V_{th}$ of the HEMT 3 is applied to the Si SBD 2 after the HEMT 3 has been turned off by increasing the voltage between the terminals 21 and 22. The entire voltage between these terminals 21 and 22 has been applied between the drain D and gate G of the HEMT 3, so that the maximum voltage to be withstood by this device 1 depends upon how much voltage the HEMT 3 can withstand between its drain D and gate G Being made from a nitride semiconductor, the HEMT 3 will tolerate a drain-gate voltage of, say, 600 volts, which is higher than the maximum applicable voltage of the Si SBD 2, while the turn-on resistance of the HEMT is kept low enough.

Figure 4:
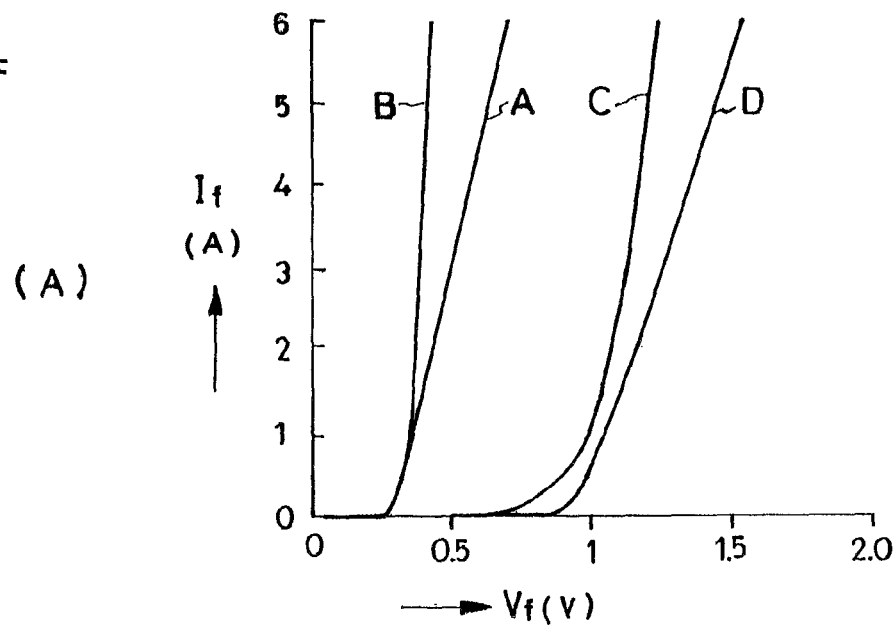
FIG. 4 graphically indicates at (A) the relationship between the forward voltage and forward current of the composite semiconductor device of FIG. 1 compared with like relationships as exhibited by some pertinent prior art devices and at (B) the relationship between the gate-source voltage and source current of the high electron mobility transistor.
Figure 4:
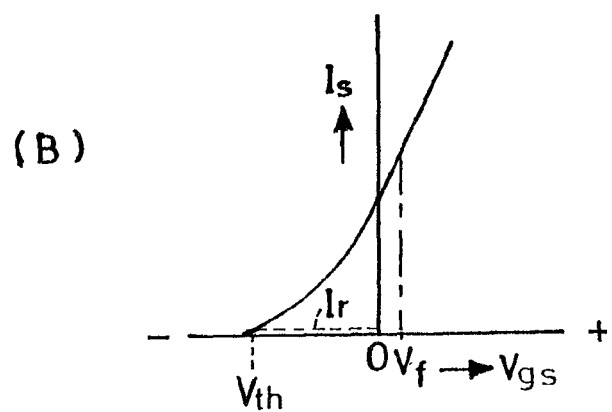

The capital A in the graph shown at (A) in FIG. 4 represents the curve of the forward current $I_f$ of the above 600-volt device 1 against the forward voltage $V_f$. The curve B in the same graph represents the same correlation exhibited by the prior art low voltage Si SBD. A comparison of these curves A and B will reveal that the forward voltages $V_f$ of the inventive device 1 is approximately equal to that of the prior art SBD during the startup period but becomes higher thereafter, as at a forward current value $I_f$ of five amperes. Nevertheless, the forward voltage $V_f$ of the inventive device 1 is definitely less than those of the prior art silicon FRD (curve C) and prior art gallium nitride or silicon carbide SBD (curve D) both during the startup period and thereafter. It is thus seen that the present invention succeeds in provision of a diode-like composite semiconductor device that is comparatively low in forward voltage $V_f$ in spite of a high voltage withstanding capability.

It is clear from the foregoing that the Si SBD 2 of the composite semiconductor device 1 is required to possess the following electrical properties for the successful functioning of the device:

1. A forward current greater than the current between the gate G and drain D of the HEMT 3 when the latter is on.

2. A forward voltage $V_f$ less than that of the prior art SBDs made from gallium nitride, silicon carbide or like semiconductors that are greater in bandgap than silicon.

3. A voltage withstanding capability higher than the threshold voltage $V_{th}$, of the HEMT 3.

The HEMT 3 of the composite semiconductor device 1, on the other hand, must possess the following electrical properties for the successful performance of the device:

1. To be normally on, or not to be turned off by the forward voltage of the Si SBD 2 but to stay on.

2. When the HEMT 3 is on, to have a voltage between gate G and drain D higher than the forward voltage $V_f$ of the Si SBD 2.

3. To be capable of withstanding a voltage between gate G and drain D higher than the voltage withstood by the Si SBD 2.

4. A threshold voltage less than the voltage withstood by the Si SBD 2.

Figure 5:
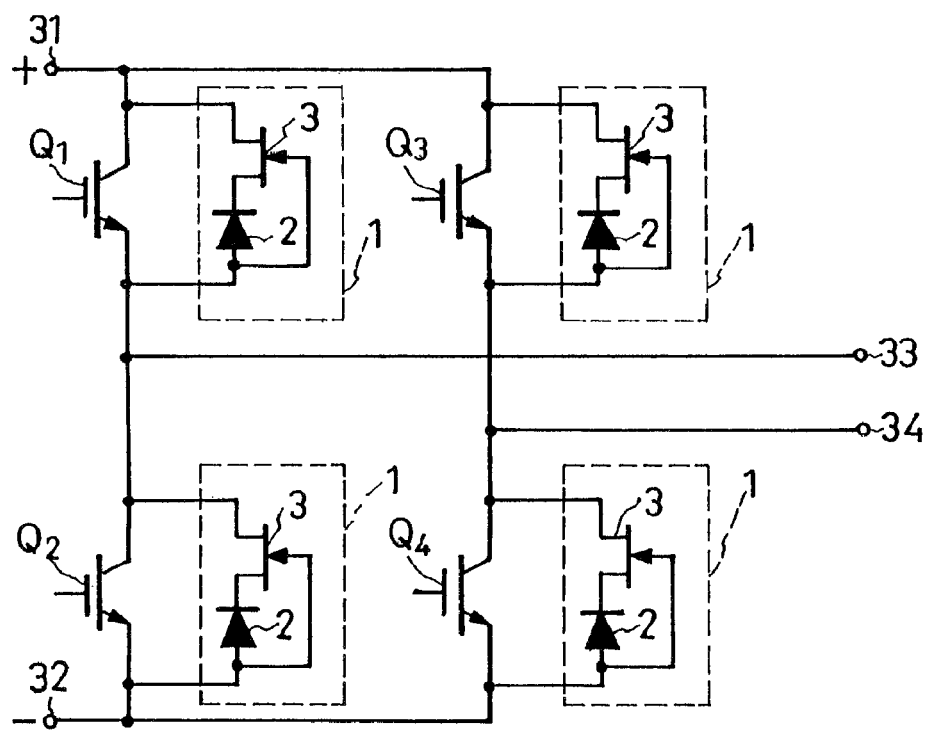
FIG. 5 is a schematic electrical diagram of an inverter utilizing the composite semiconductor devices each constructed as depicted in FIG. 1.

The composite semiconductor devices 1 according to the invention, each constructed and operating as hereinbefore described with reference to FIGS. 1-4, lend themselves to use in an inverter circuit diagramed in FIG. 5. Essentially, the inverter circuit comprises a serial circuit of a first and a second switch $Q_1$ and $Q_2$ and another serial circuit of a third and a fourth switch $Q_3$ and $Q_4$, both connected between a first and a second DC terminal 31 and 32. The junction between the first and the second switch $Q_1$ and $Q_2$ is connected to a first AC terminal 33, and the junction between the third and the fourth switch $Q_3$ and $Q_4$ to a second AC terminal 34. The switches $Q_1$-$Q_4$, all shown as insulated gate bipolar transistors, are turned on and off by pulse-width-modulated control signals at a relatively high rate of, say, 20-1000 kilohertz.

Connected in parallel with the respective switches $Q_1$-$Q_4$, the composite semiconductor devices 1 of this invention function as feedback or regenerative diodes. Thus, in applications where the pair of AC terminals 33 and 34 are connected to an inductive load such as an electric motor, not shown, there will develop between these AC terminals a voltage oriented to forward bias the Si SBDs 2 of the composite semiconductor devices 1, thereby causing conduction therethrough. As the normally-on HEMTs 3 also conduct, a current may flow through both Si SBDs 2 and HEMTs 3 of the composite semiconductor devices 1 for regenerative or feedback purposes. The composite semiconductor devices 1 find use as rectifiers not only in inverters but in DC-to-DC converters and a variety of other applications as well.

Optionally, as indicated by broken lines in FIGS. 1 and 2(A) and therein designated 23, the composite semiconductor device 1 may be equipped with a third terminal. So equipped, the composite semiconductor device 1 permits use in combination with another field effect transistor such as a silicon insulated-gate field effect transistor (Si IGFET) or silicon metal-oxide-semiconductor field effect transistor (Si MOSFET) 24 as in FIG. 6. The Si MOSFET 24 has its drain D connected to the third terminal 23 of the composite semiconductor device 1, and its source S to the first terminal 21 of the device. A pulse-width-modulated control signal is impressed to the gate G of the n-channel Si MOSFET 24 for turning the same on and off.

In the above possible use of the composite semiconductor device 1, the familiar parasitic diode (pn-junction diode) of the n-channel Si MOSFET 24 is substitutable for the Si SBD 2 of the device. The n-channel Si MOSFET 24 is itself replaceable by a standard transistor, with the collector of that transistor connected to the third terminal 23 and its emitter to the first terminal 21.

Figure 6:
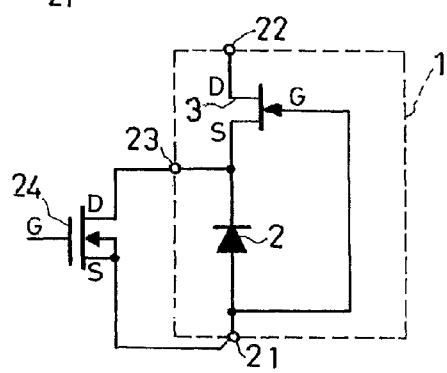
FIG. 6 is a schematic electrical diagram of a slight modification of the composite semiconductor device of FIG. 1.

The Si SBD 2 and HEMT 3 of the composite semiconductor device 1 in its application to the circuit in FIG. 6 may have their characteristics determined just like those enumerated above in conjunction with FIG. 2 (A). There is one more prerequisite, however. The drain-source voltage $V_{ds}$ of the Si MOSFET 24 is impressed between the gate and source of the HEMT 3 when that MOSFET is on. The drain-source voltage $V_{ds}$ of the Si MOSFET 24 should therefore not exceed the threshold voltage of the HEMT 3. The Si MOSFET 24 in use may be the one with a relatively low voltage-withstanding capability and low resistance.

In the operation of the FIG. 6 circuit, when the Si MOSFET 24 is on, and the second terminal 22 higher in potential than the first 21, the current will flow along the path sequentially comprising the second terminal 22, HEMT 3, third terminal 23, Si MOSFET 24, and first terminal 21. The composite semiconductor device 1 of the FIG. 6 circuit operates just like its FIG. 2 (A) counterpart when the Si MOSFET 24 is off while the second terminal 22 is higher in potential than the first 21. As has been explained, the composite semiconductor device 1 has an improved antivoltage strength as the HEMT 3 has a greater voltage withstanding capability between its drain D and gate G than that of the Si SBD 2.

When the Si MOSFET 24 is off while the first terminal 21 is higher in potential than the second 22, the current will flow for regenerative or feedback purposes along a relatively low resistance path sequentially comprising the first terminal 21, Si SBD 2, HEMT 3, and second terminal 22 as in the case of FIG. 2 (A). Thus the composite semiconductor device 1 of the FIG. 6 circuit offers the same advantages as its counterparts in FIG. 5.

Figure 7:
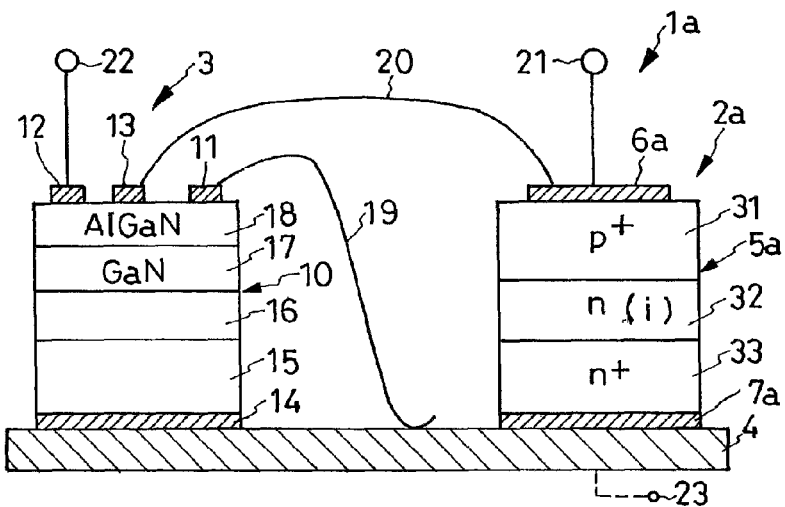
FIG. 7 is a schematic diagram of another preferred form of composite semiconductor device according to the invention.

Embodiment of FIG. 7

This second preferred form of composite semiconductor device $1_a$ features a Si pn-junction diode $2_a$ employed in lieu of the Si SBD 2, FIG. 1, of the first described composite semiconductor device 1. All the other details of construction of this device $1_a$ are as previously set forth in connection with the first described device 1.

The Si pn-junction diode $2_a$ of the second composite semiconductor device $1_a$ has a body $5_a$ of doped silicon between an anode or first electrode $6_a$ and a cathode or second electrode $7_a$. The silicon body $5_a$ is a lamination of a first semiconductor layer shown as a p$^+$-type semiconductor layer 31, a second semiconductor layer shown as an n-type semiconductor layer 32, and a third semiconductor layer shown as an n$^+$-type semiconductor layer 33, arranged in that order from anode $6_a$ toward cathode $7_a$. The n-type semiconductor layer 32 is less in n-type impurity concentration than the n$^+$-type semiconductor layer 33. Alternatively, an intrinsic semiconductor layer could be adopted in place of the n-type semiconductor layer 32 thereby providing a pin-junction diode.

The anode $6_a$ of the Si pn-junction diode $2_a$ makes ohmic contact with the p$^+$-type semiconductor layer 31 and is electrically coupled to the first terminal 21. The cathode $7_a$ on the other hand makes ohmic contact with the n$^+$-type semiconductor layer 33 and is coupled to the baseplate 4 both mechanically and electrically. The second conductor 20 is connected to the anode $6_a$ of the Si pn-junction diode $2_a$ at one end and to the gate electrode 13 of the HEMT 3 at the other.

This second composite semiconductor device $1_a$ may be equivalently diagrammed as in FIG. 2 (A) only with a simple replacement of the Si SBD 2 shown there by the Si pn-junction diode $2_a$. Just like the low-voltage Si SBD 2, the Si pn-junction diode $2_a$ has a lower forward voltage $V_f$ than the comparable conventional diodes such as GaN SBDs, SiC SBDs, and Si FRDs, so that the second composite semiconductor device $1_s$ offers the same benefits as does the first described device 1.

Admittedly, the Si pn-junction diode $2_a$ gives rise to the storage of minority carriers because of the presence of the pn junction. A reverse recovery current will therefore flow when the device is turned off, with consequent delay in response. However, the Si pn-junction diode $2_a$, is designed to withstand a voltage less than the maximum allowable voltage between the gate and drain of the HEMT 3. Having a semiconductor region of high impurity concentration, the low-voltage Si pn-junction diode $2_a$ has a shorter reverse recovery time than does the prior art high-voltage Si FRD. As is well known, the higher the impurity concentration of semiconductor regions, the shorter is the lifetime of the minority carriers, and so is the reverse recovery time. Consequently, despite the use of the pn-junction diode $2_s$, the composite semiconductor device $1_a$ has a less reverse recovery time than does the conventional high-voltage Si FRD.

Figure 8:
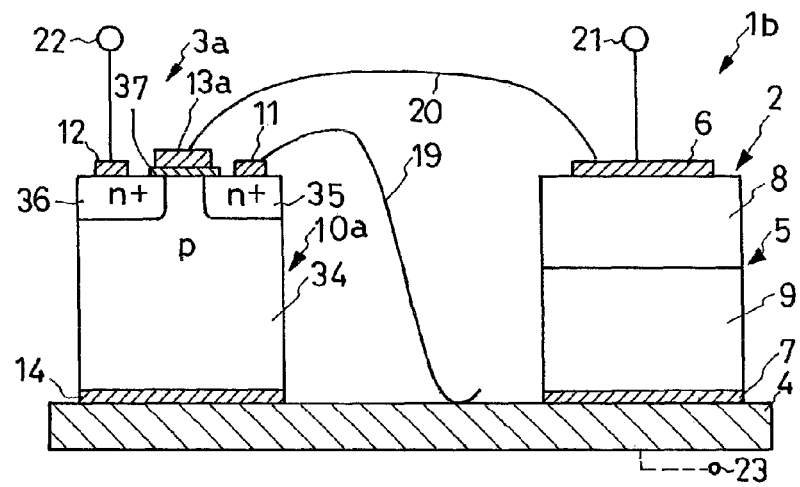
FIG. 8 is a schematic diagram of yet another preferred form of composite semiconductor device according to the invention.
Figure 9:
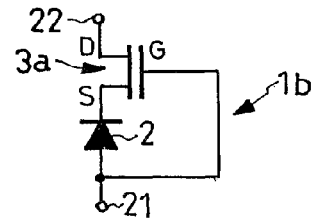
FIG. 9 is a schematic electrical diagram of the FIG. 8 device.

Embodiment of FIGS. 8 and 9

In these figures is shown the third preferred form of composite semiconductor device $1_b$ according to the invention, which is akin to its FIG. 1 counterpart 1 except that the HEMT 3 of the latter is replaced by a normally-on or depletion-mode metal-insulator semiconductor field effect transistor (MISFET) $3_a$. The MISFIT $3_a$ might also be called an insulated-gate field effect transistor (IGFET). All the other details of construction are as previously described with reference to FIGS. 1 and 2 (A). Thus the MISFIT $3_a$ is put to combined use with the Si SBD 2 in this third embodiment.

The MISFET $3_a$ of the third composite semiconductor device $1_b$ has a GaN semiconductor body $10_a$. Formed in selected positions on the top of the semiconductor body $10_a$ are a source electrode 11, drain electrode 12, and gate electrode 13. A back electrode 14 underlies the semiconductor body $10_a$.

The GaN semiconductor body $10_a$ of the MISFET $3_a$ has formed therein a p-type semiconductor region 34, a source region (first n⁺-type semiconductor region) 35, and a drain region (second n⁺-type semiconductor region) 36. The source electrode 11 and drain electrode 12 make ohmic contact with the first and the second n⁺-type semiconductor regions 35 and 36, respectively. The gate electrode 13 is formed via a gate insulator 37 on that part of the p-type semiconductor region 34 which is interposed between the two n⁺-type semiconductor regions 35 and 36 and which is exposed at the top surface of the semiconductor body $10_a$. The gate electrode $13_a$ is electrically coupled to the anode 6 of the Si SBD 2 via the second conductor 20.

The third composite semiconductor device $1_b$ may be equivalently electrically diagrammed as in FIG. 9. The Si SBD 2 will be forward biased, and the MISFET $3_a$ will turn on, when the first terminal 21 is higher in potential than the second 22. A current will then flow along the path sequentially comprising the first terminal 21, Si SBD 2, MISFET $3_a$, and second terminal 22. Being normally on (depletion mode), the MISFET $3_a$ will have an n-channel (inversion) layer formed in the surface of the p-type semiconductor region 34 while no positive voltage is being impressed to the gate electrode $13_a$. Upon application of a positive voltage to the gate G via the first terminal 21, the n-channel will expand to crease the drain-to-source voltage. The Si SBD 2 will be reverse biased and be off when the second terminal 22 is higher in potential than the first 21. The MISFET $3_a$ will also be off as a negative voltage is applied to its gate G. The off-state voltage withstanding capability of this device $1_b$ depends upon that between the drain and gate of the MISFET $3_a$.

It is now apparent that the third composite semiconductor device $1_b$ possesses all the listed advantages of the first disclosed device 1. Additionally, thanks to the MISFET $3_a$ with its insulated gate construction, this device $1_b$ when off has less current leakage from between drain and gate than does the first device 1.

As a possible modification of this composite semiconductor device $1_b$, the semiconductor body $10_a$ of the MISFET $3_a$ may be made from materials other than GaN, such for example as silicon or compound semiconductors like gallium arsenide. Also, the Si SBD 2 of this device $1_b$ is replaceable by the Si pn-junction diode $2_a$, FIG. 7, or Si pin-junction diode.

Figure 10:
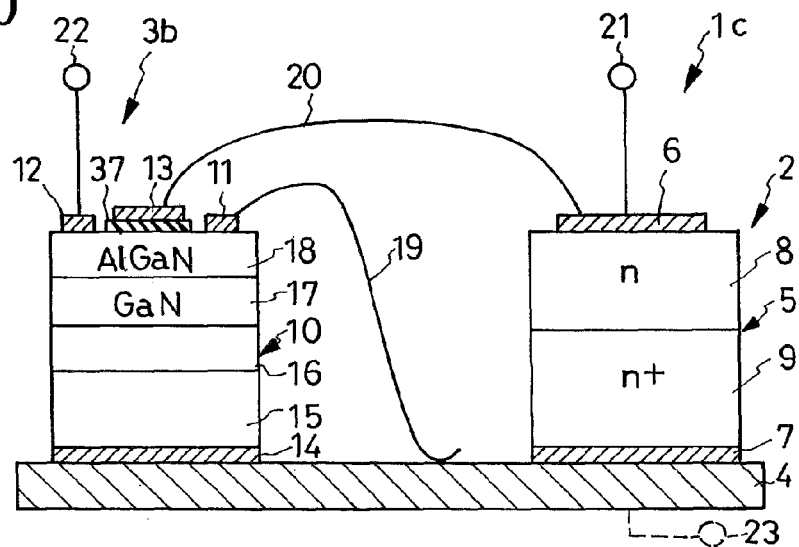
FIG. 10 is a schematic electrical diagram of still another preferred form of composite semiconductor device according to the invention.

Embodiment of FIG. 10

Here is shown a further preferred form of composite semiconductor device 1, which is similar in construction to its FIG. 1 counterpart 1 except that a HEMT-type MISFET $3_b$ is employed as the normally-on HEMT 3 of the latter device. The HEMT-type MISFET $3_b$ in turn differs from its FIG. 1 counterpart 3 in additionally comprising a gate insulator 37 between the gate electrode 13 and the electron supply layer 18 of the semiconductor body 10. The HEMT-type MISFET $3_b$ might therefore be also termed a MIS-type HEMT. Like the HEMT 3, FIG. 1, the MISFET $3_b$ is normally on as a two-dimensional electron gas layer due to the heterojunction between electron transit layer 17 and electron supply layer 18 is created adjacent the interface therebetween.

When the first terminal 21 of the fourth composite semiconductor device 1 is less in potential than the second 22, the gate electrode 13 has a less potential than the source electrode 11. The result is the appearance of a depletion layer pinching off the two-dimensional gas layer, which makes the MISFET $3_b$ off. Since this modified MISFET $3_b$ is electrically configured just like the MISFET $3_a$ of the third composite semiconductor device $1_b$ in FIG. 9, the voltage withstanding capability of the device 1 when the Si SBD 2 and MISFET $3_b$ are off depends upon that between the drain and gate of the MISFET $3_b$. Thus the device $1_c$ gains the same benefits as do the devices of FIGS. 1 and 8.

The Si SBD 2 of this device $1_c$ is replaceable by a silicon pn-junction diode, pin-junction diode or the like. The semiconductor body 10 of the MISFET $3_b$ may also be made from other compound semiconductors such as gallium arsenide.

Figure 11:
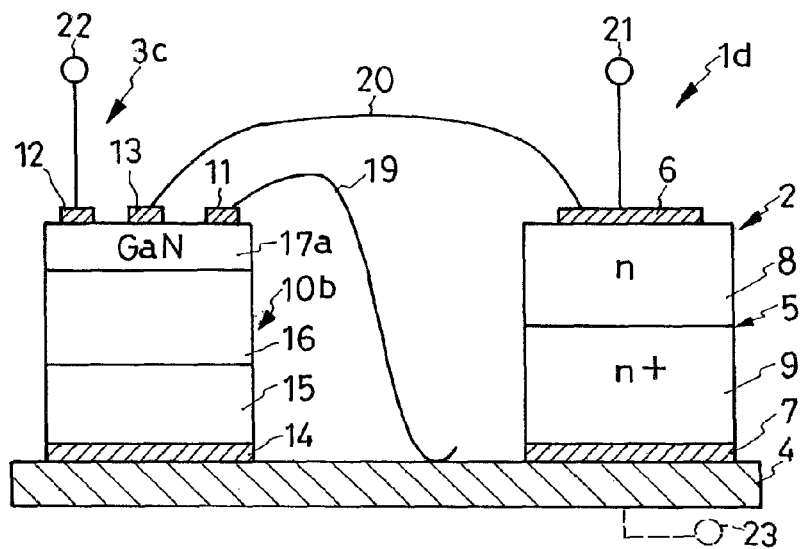
FIG. 11 is a schematic electrical diagram of a further preferred form of composite semiconductor device according to the invention.

Embodiment of FIG. 11

A further preferred form of composite semiconductor device Id is of the same construction as that of FIG. 1 except that the normally-on FET takes the form of a metal semiconductor field effect transistor (MESFET) 3, as in FIG. 11. The MESFET $3_c$ has a semiconductor body $10_b$ which is similar in configuration to the semiconductor body 10 of the HEMT 3, FIG. 1, except that the former has an n-type GaN semiconductor layer $17_a$ in substitution for the electron transit layer 17 and electron supply layer 18 of the latter. All the other details of construction are as stated above with reference to FIG. 1.

Since the buffer layer 16 directly overlying the substrate 15 of the semiconductor body $10_b$ of this device $1_d$ is a semi-insulator, the current flows between source electrode 11 and drain electrode 12 through the GaN semiconductor layer $17_a$ on the buffer layer 16. Both source electrode 11 and drain electrode 12 are in ohmic contact with the GaN semiconductor layer $17_a$. As required, $n^+$-type semiconductor inserts may be provided under the source electrode 11 and drain electrode 12 in order to aid in their ohmic contact with the semiconductor layer $17_a$. The gate electrode 13 is in Schottky contact with the semiconductor layer $17_a$. Upon application of a reverse bias to this Schottky contact junction between gate electrode 13 and semiconductor layer $17_a$, a depletion layer is created in the layer $17_a$ thereby interrupting the channel between source electrode 11 and drain electrode 12. Thus is the MESFET 3, turned off.

As is well known, the MESFET 3, performs the same functions as the HEMT 3, FIG. 1, so that this composite semiconductor device $1_d$ may also be equivalently electrically diagramed as in FIG. 2 (A). The device $1_d$ obtains the same advantages as does the first disclosed device 1.

The Si SBD 2 of this device $1_d$ is replaceable by a silicon pn-junction diode, pin-junction diode or the like. The semiconductor body $10_b$ of the MISFET $3_c$ may also be made from other compound semiconductors that have a wider bandgap than silicon, such as gallium arsenide.

Figure 12:
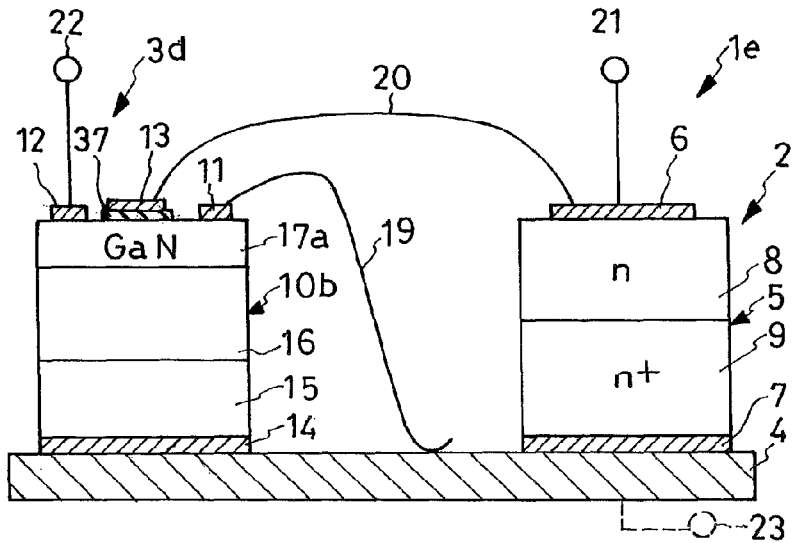
FIG. 12 is a schematic electrical diagram of a further preferred form of composite semiconductor device according to the invention.

Embodiment of FIG. 12

In this figure a MISFET $3_d$ is used as the normally-on FET in place of the HEMT 3 of the FIG. 1 device 1 or the MESFET $3_c$ of the FIG. 11 device in order to provide a further preferred form of composite semiconductor device $1_e$ according to the invention. All the other details of construction are as described above in connection with FIG. 1 or 11.

The MISFET $3_d$ of this device $1_e$ is analogous in construction with the MESFET $3_c$, FIG. 11, of the device $1_d$ except for the addition of a gate insulator 37 between the gate electrode 37 and the GaN semiconductor layer $17_a$ of the semiconductor body $10_b$. The MISFET $3_d$ may therefore be called either a MESFET-type MISFET or a MIS-type MESFET. The semiconductor layer $17_a$ provides a channel when either no voltage, or a positive voltage, is being impressed to the gate. Therefore, the MISFET $3_d$ is normally on like the HEMT 3, FIG. 1, and MESFET $3_c$, FIG. 11.

When the first terminal 21 of this composite semiconductor device $1_e$ is less in potential than the second terminal 22, the gate electrode 13 has a less potential than the source electrode 11. The result is the creation of a depletion layer in the semiconductor layer $17_a$, which blocks the channel in that layer thereby turning off the MISFET $3_d$. The MISFET $3_d$ being electrically circuited as in FIG. 9, the voltage withstanding capability of the device $1_e$ when the Si SBD 2 and MISFET $3_d$ are off depends upon that between the drain and gate of the MISFET $3_d$. Consequently, this device $1_e$ provides the same benefits as do the embodiments of FIGS. 1, 8 and 11.

The Si SBD 2 of this embodiment is replaceable by the Si pn-junction diode $2_a$, FIG. 7, a pn-junction diode or the like. The semiconductor body $10_b$ may be made from other compound semiconductors such as gallium arsenide.

Figure 13:
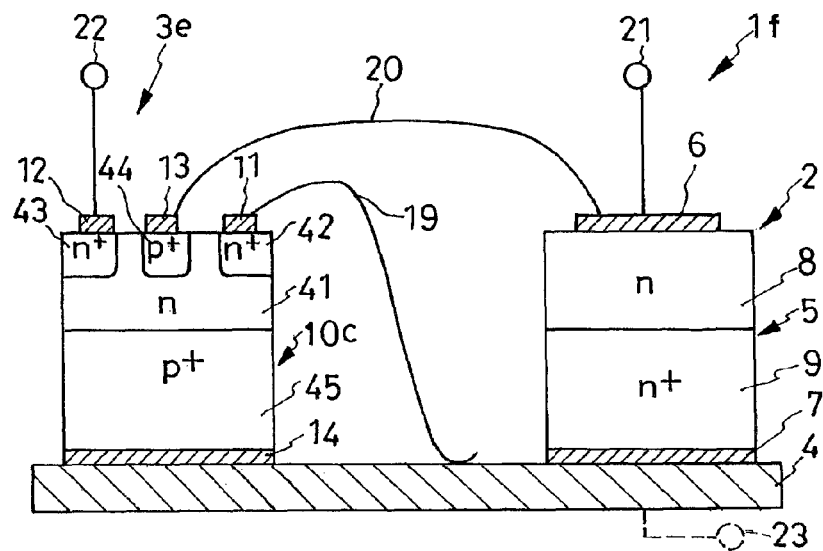
FIG. 13 is a schematic electrical diagram of a further preferred form of composite semiconductor device according to the invention.

Embodiment of FIG. 13

A junction gate field effect transistor (JFET) $3_e$ is here used as the normally-on FET in combination with the Si SBD 2 to provide a further preferred form of composite semiconductor device $1_f$ according to the invention. All the other details of construction are as described above in connection with FIG. 1.

The JFET 3, of the composite semiconductor device $1_f$ has a GaN semiconductor body $10_c$ which is selectively doped to comprise an n-type semiconductor layer 41 which is to provide a channel, and, all contiguous to this n-type semiconductor layer, an $n^+$-type source region 42, $n^+$-type drain region 43, and two $p^+$-type semiconductor regions 44 and 45. The semiconductor body $10_c$ may be made larger in chip area than the semiconductor body 5 of the Si SBD 2 with a view to reduction of turn-on resistance. The gate electrode 13 is in ohmic contact with the $p^+$-type semiconductor region 44.

When no voltage, or a positive voltage, is being impressed to the gate electrode 13 of the JFET $3_e$, there is created no depletion region due to the pn-junctions of the $p^+$-type semiconductor regions 44 and 45 and n-type semiconductor layer 41. The n-type semiconductor layer 41 functions then as the channel. The JFET $3_e$ of this device it is therefore normally on. The Si SBD 2 is reverse biased when the first terminal 21 is less in potential than the second 22. Further, as a negative potential is impressed to the gate electrode 13, a depletion layer appears in the n-type semiconductor layer 41 thereby interrupting the channel and so turning off the JFET $3_e$.

This composite semiconductor device $1_f$ is electrically circuited as equivalently diagramed in FIG. 2 and so has the same benefits as does the first disclosed device 1. The Si SBD 2 of the device $1_c$ is also replaceable by the Si pn-junction diode $2_a$, FIG. 7, a pin-junction diode or the like. The semiconductor body $10_c$ of the JFET 3, of the device $1_f$ may be made from silicon, gallium arsenide or other compound semiconductors instead of from gallium nitride.

Figure 14:
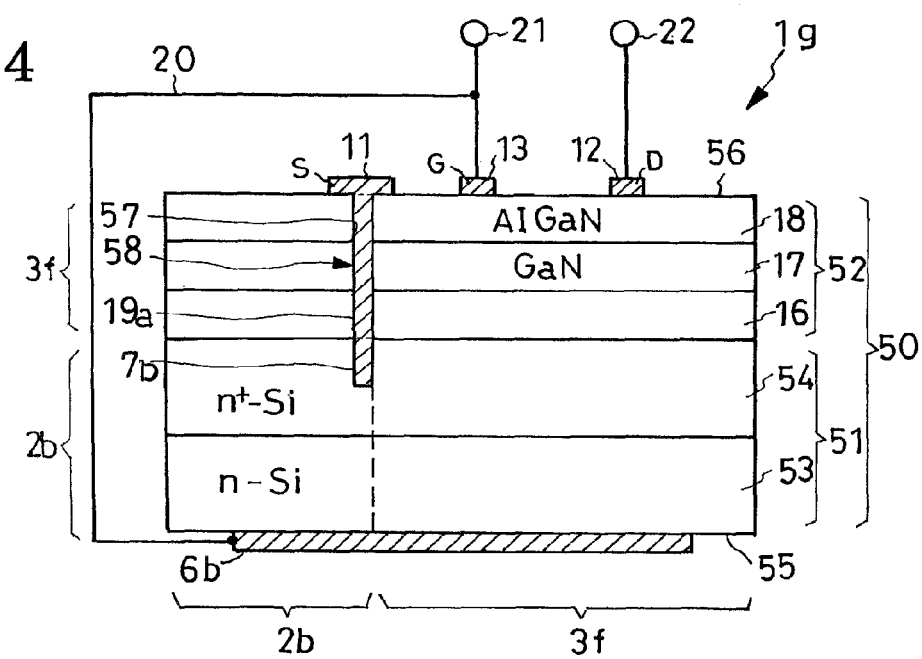
FIG. 14 is a schematic electrical diagram of a further preferred form of composite semiconductor device according to the invention.

Embodiment of FIG. 14

The composite semiconductor device $1_g$ of FIG. 14 is akin to the first described device 1 in having an Si SBD $2_b$ and HEMT $3_f$ of the same functions as their FIG. 1 counterparts 2 and 3 but differs therefrom in that the Si SBD $2_b$ and HEMT $3_f$ are not discrete units but are integrated into one semiconductor body 50.

The integral semiconductor body 50 of the composite semiconductor device $1_g$ is broadly constituted of a silicon semiconductor region 51 and nitride semiconductor region 52. The silicon semiconductor region 51 is for the Si SBD $2_b$, and the nitride semiconductor region 52 for the HEMT $3_f$.

The silicon semiconductor region 51 of the integral semiconductor body 50 is a lamination of an n-type silicon semiconductor layer 53 and an $n^+$-type silicon semiconductor layer 54. Exposed at the first major surface 55 of the integral semiconductor body 50, the n-type silicon semiconductor layer 53 is in Schottky contact with an underlying Schottky electrode $6_b$ which is to serve as anode. The $n^+$-type silicon semiconductor layer 54 is contiguous to the n-type silicon semiconductor layer 53 and equivalently functions as cathode for the Si SBD $2_b$. The silicon semiconductor region 51 not only provides the layers 53 and 54 for the Si SBD $2_b$ but serves as substrate for epitaxial growth of the overlying nitride semiconductor region 52.

Like the semiconductor body 10, FIG. 1, of the HEMT 3 of the first disclosed device 1, the nitride semiconductor region 52 of the integral semiconductor body 50 is a lamination of the buffer layer 16, GaN electron transit layer 17, and AlGaN electron supply layer 18. Exposed at the second major surface 56 of the integral semiconductor body 50, the electron supply layer 18 has formed thereon the source electrode 11, drain electrode 12 and gate electrode 13 for the HEMT $3_f$ like those for the HEMT 3 in the FIG. 1 embodiment. The gate electrode 13 of the HEMT $3_f$ is in Schottky contact with the electron supply layer 18 and, also like that of the HEMT 3 in the FIG. 1 embodiment, electrically connected to the first terminal 21. The drain electrode 12 of the HEMT $3_f$ is electrically connected to the second terminal 22.

The source electrode 11 of the HEMT $3_f$ is electrically connected to the $n^+$-type silicon semiconductor layer 54 which functions as cathode for the Si SBD $2_b$. Employed for such connection is a conductor 58 received in a well 57 extending from the second major surface 56 of the integral semiconductor body 50 toward the first 55 and terminating in the $n^+$-type silicon semiconductor layer 54. Thus the conductor 58 includes part $19_a$ extending through the nitride semiconductor region 52 of the integral semiconductor body 50 in direct contact therewith, and part $7_b$ embedded in the $n^+$-type silicon semiconductor region 54. The conductor part $19_a$ is similar in function to the conductor 19 of the FIG. 1 embodiment, and the conductor part $7_b$ to the cathode 7 of the FIG. 1 embodiment. The gate electrode 13 is electrically connected to the Schottky electrode $6_b$ of the Si SBD $2_b$ via the conductor 20.

Being electrically circuited as in FIG. 2, this composite semiconductor device $1_g$ possesses all the listed benefits of the FIG. 1 embodiment. As an additional advantage the device $1_g$ is manufacturable compactly and inexpensively as the Si SBD $2_b$ and HEMT $3_f$ are built on the same semiconductor body 50.

The HEMT $3_f$ of this device $1_g$ is replaceable by either the MISFET $3_a$, FIG. 8, MISFET $3_b$, FIG. 10, MESFET $3_c$, FIG. 11, MISFET $3_d$, FIG. 12, or JFET $3_e$, FIG. 13. The nitride semiconductor region 52 may be made from some other compound semiconductors having a greater bandgap than silicon.

Figure 15:
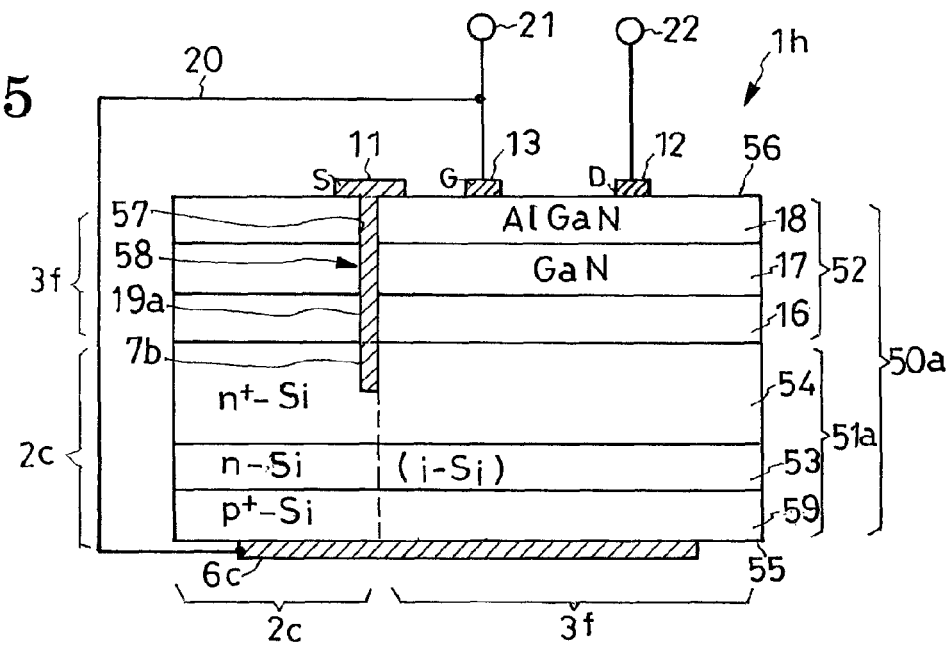
FIG. 15 is a schematic electrical diagram of a further preferred form of composite semiconductor device according to the invention.

Embodiment of FIG. 15

The composite semiconductor device $1_h$ in this figure is identical with the device $1_g$ of FIG. 14 except for use of a Si pn-junction diode $2_c$ in place of the Si SBD $2_b$. The device $1_h$ has an integral semiconductor body $50_a$ for both Si pn-junction diode $2_c$ and HEMT $3_f$. The integral semiconductor body $50_a$ differs from its FIG. 14 counterpart 50 only in that the silicon semiconductor region $51_a$ of the former additionally comprises a $p^+$-type silicon semiconductor layer 59 for providing the pn-junction diode $2_c$. The $p^+$-type silicon semiconductor layer 59 is contiguous to the n-type semiconductor layer 53 and is exposed at the first major surface 55 of the semiconductor body $50_a$, making ohmic contact with the anode $6_c$.

Thus the Si pn-junction diode $2_c$ is constituted of: (a) that part $7_b$ of the conductor 58 which is buried in the semiconductor body $50_a$ into contact with the $n^+$-type silicon semiconductor layer 54 to serve as cathode; (b) the n-type silicon semiconductor layer 53; (c) the $p^+$-type silicon semiconductor layer 59; and (d) the anode $6_c$. The n-type silicon semiconductor layer 53 is less in n-type dopant concentration than the $n^+$-type silicon semiconductor layer 54. An intrinsic semiconductor layer, not containing a conductivity type determinant, could be substituted for the n-type silicon semiconductor layer 53 thereby provide a pin-junction diode.

As the anode $6_c$ is connected to the gate electrode 13 of the HEMT $3_f$ by the conductor 20, this composite semiconductor device $1_h$ can be equivalently electrically diagramed as in FIG. 2. Thus does this device $1_h$ gain the same benefits as do the device 1, FIG. 1, and device $1_g$, FIG. 14.

Figure 16:
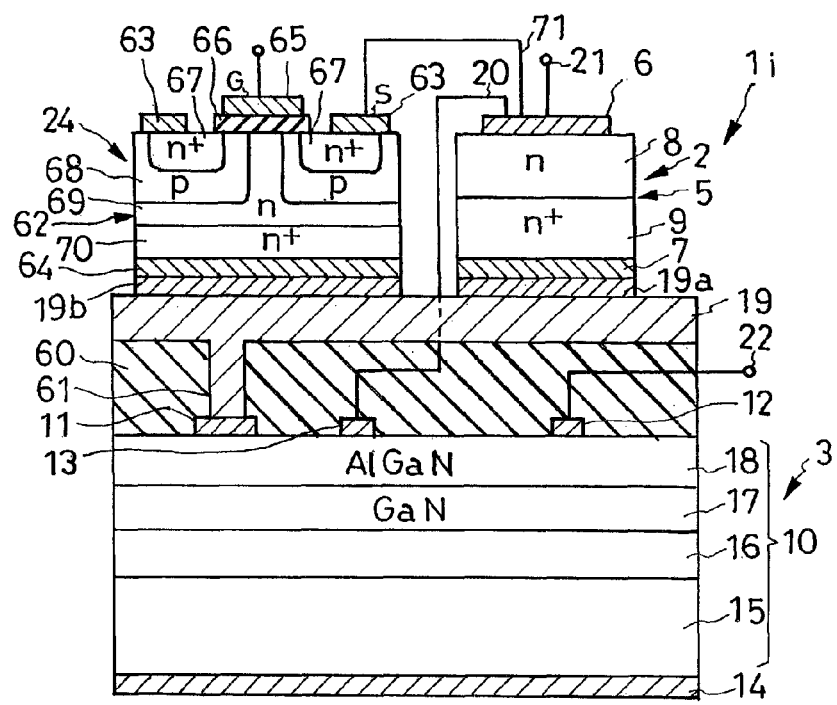
FIG. 16 is a schematic electrical diagram of a further preferred form of composite semiconductor device according to the invention.

Embodiment of FIG. 16

In this composite semiconductor device $1_i$, the Si SBD 2, FIG. 1, of the composite semiconductor device 1 is placed on the HEMT 3, FIG. 1, via an electrically insulating layer 60 of polyimide or the like. Also formed on the insulating layer 60 is a MOSFET 24 described above with reference to FIG. 6. All the other details of construction are as previously set forth with reference to FIG. 1.

The insulating layer 60 of the composite semiconductor device $1_i$ is formed on the semiconductor body 10 of the HEMT 3 so as to envelope all of the source electrode 11, drain electrode 12 and gate electrode 13 thereon. Formed on this insulating layer 60, as by copper plating, is the first conductor 19 to which the cathode 7 of the Si SBD 2 is coupled, both mechanically and electrically, via a layer $19_a$ of an electroconductive bonding agent such as solder. The first conductor 19 is formed to include a part extending through a hole 61 in the insulating layer 60 and so electrically coupled to the source electrode 11 of the HEMT 3. The anode 6 of the Si SBD 2 is electrically coupled to the gate electrode 13 of the HEMT 3 via the second conductor which is indicated diagrammatically at 20. The drain electrode 12 of the HEMT 3 is coupled to the second terminal 22 of the device $1_i$.

Additionally incorporated in this composite semiconductor device $1_i$, the MOSFET 24 is of vertical design having a source electrode 63 on the first of the pair of opposite major surfaces of a silicon semiconductor body 62 and a drain electrode 64 on the second major surface. A gate electrode 65 is formed on the second major surface of the body 62 via a gate insulator 66.

The silicon semiconductor body 62 has an $n^+$-type source region 67 exposed at its first major surface, a p-type channel (body) region 68 surrounding the source region 67, an n-type drain region 69 contiguous to the p-type channel region 68, and an $n^+$-type drain region 70 exposed at the second major surface of the body 62.

The source electrode 63 of the MOSFET 24 is in ohmic contact with both source region 67 and part of the channel region 68. The source electrode 63 is coupled to the anode 6 of the Si SBD 2 via a third conductor 71. The drain electrode 64 of the MOSFET 24 is in ohmic contact with the $n^+$-type drain region 70 and is coupled both mechanically and electrically to the first conductor 19 via an electroconductive bonding agent $19_b$.

The MOSFET 24 is electrically connected to the Si SBD 2 and HEMT 3 just like that indicated by the same reference numeral in FIG. 6. This composite semiconductor device $1_i$ is therefore electrically circuited as in FIG. 6.

Comprising the Si SBD 2 and HEMT 3 like its FIG. 1 counterpart 1, this composite semiconductor device $1_i$ offers the same noted advantages therewith, in addition to the following ones unique thereto:

1. With the Si SBD 2 disposed atop the HEMT 3, the device $1_i$ does without a baseplate such as that designated 4 in FIG. 10 and so is manufacturable more compactly and inexpensively.

2. With the MOSFET 24 placed atop the HEMT 3, the circuit of FIG. 6 is manufacturable compactly.

3. Being independent from the electrical connections of the device $1_i$, the back electrode 14, as well as the baseplate which may be coupled thereto, may have its potential determined optimally for stable performance of the HEMT.

The Si SBD 2 of this device 1 is replaceable by the Si pn-junction diode $2_a$, FIG. 7. The HEMT 3 of the device 11 is also replaceable by the MISFET of FIG. 8, the HEMT-type MISFET of FIG. 10, the MESFET of FIG. 11, the MESFET-type MISFET of FIG. 12, or the JFET of FIG. 13.

Figure 17:
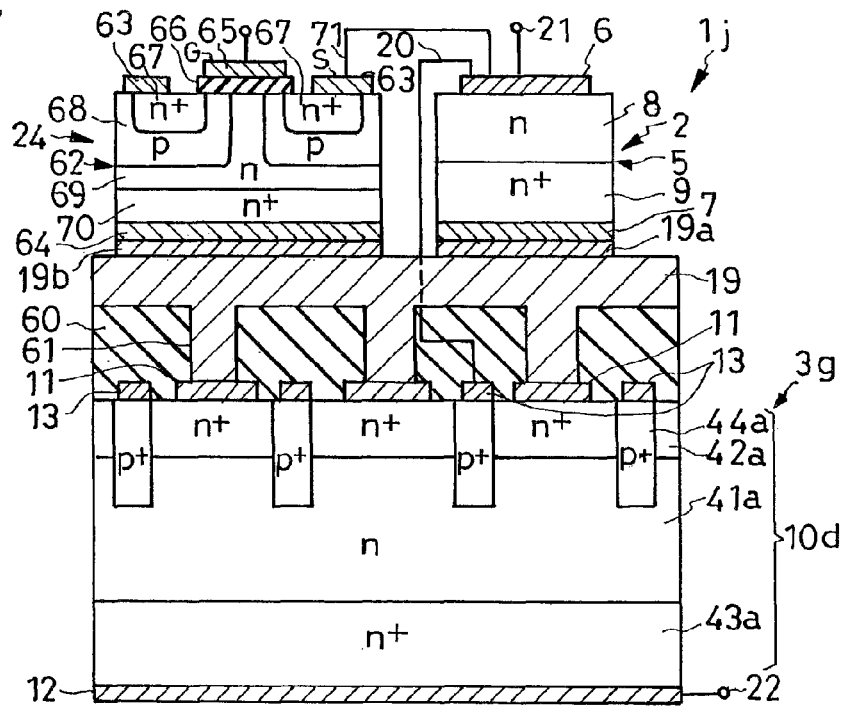
FIG. 17 is a schematic electrical diagram of a further preferred form of composite semiconductor device according to the invention.

Embodiment of FIG. 17

Employed as the normally-on FET in this composite semiconductor device $1_j$ is a JFET or SIT (static induction transistor) $3_g$ in place of the HEMT 3 of the FIG. 16 embodiment. The device $1_j$ is identical with the above described device $1_i$, FIG. 16, in all the other details of construction.

The JFET $3_g$ of the composite semiconductor device $1_j$ represents an alteration of the horizontal arrangement of the different conductivity type regions of the FIG. 13 JFET $3_e$ to a vertical one. Thus the GaN semiconductor body $10_d$ of the JFET $3_g$ has its $n^+$-type source layer $42_a$, n-type semiconductor layer $41_a$ and $n^+$-type drain layer $43_a$ arranged in that order from its top toward the bottom. Further, in order to create a pn-junctions, a $p^+$-type semiconductor region $44_a$ extends from the top of the semiconductor body $10_d$ toward the bottom and terminate in the n-type semiconductor layer $41_a$. The source electrode 11 is formed on the top surface of the semiconductor body $10_d$ in ohmic contact with the $n^+$-type source layer $42_a$. The drain electrode 12 is formed on the underside of the semiconductor body $10_d$ in ohmic contact with the $n^+$-type drain layer $43_a$. The gate electrode 13 is in ohmic contact with the p-type semiconductor regions $44_a$.

When no voltage, or a positive voltage, is being impressed to the gate 13, no depletion layer is created due to the pn junction between $p^+$-type semiconductor region $44_a$ and n-type semiconductor layer $41_a$. The n-type semiconductor layer $41_a$ provides a channel, so that a current flows along the path sequentially comprising the drain electrode 12, $n^+$-type drain layer $43_a$, n-type semiconductor layer $41_a$, $n^+$-type source layer $42_a$, and source electrode 11. The JFET $3_g$ is therefore normally on.

The Si SBD 2 is off when the first terminal 21 is less in potential than the second 22. Further, as a negative voltage is impressed to the gate electrode 13, a depletion layer appears in the n-type semiconductor layer $41_a$ thereby pinching off the channel. Thus the JFET $3_g$ turns off.

Being electrically circuited as equivalently diagramed in FIG. 6, this composite semiconductor device $1_j$ offers the same benefits as does the device $1_i$, FIG. 16. The Si SBD 2 of the device $1_j$ is replaceable by the Si pn-junction diode $2_a$, FIG. 7, a pin-junction diode or the like. The semiconductor body $10_d$ may be made from gallium arsenide or other compound semiconductors or silicon rather than from gallium nitride.

Figure 18:
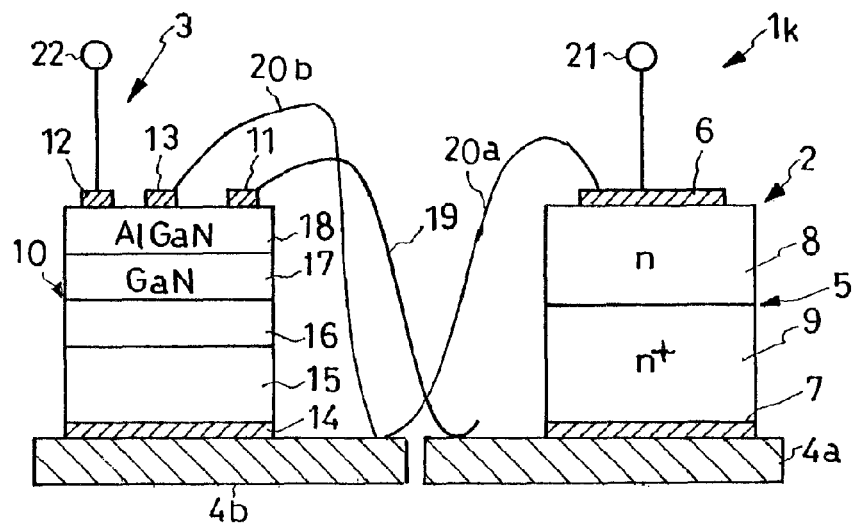
FIG. 18 is a schematic electrical diagram of a further preferred form of composite semiconductor device according to the invention.

Embodiment of FIG. 18

This composite semiconductor device $1_k$ is of substantially the same make as the device 1, FIG. 1, except that its electroconductive baseplate is divided into two parts $4_a$ and $4_b$. The Si SBD 2 is mounted on the first baseplate part $4_a$ and coupled thereto both mechanically and electrically. The HEMT 3 is mounted on the second baseplate part $4_b$ and coupled thereto both mechanically and electrically.

The Si SBD 2 of the device $1_k$ has its anode 6 connected to the second baseplate part $4_b$ via a conductor $20_a$. The HEMT 3 of the device $1_k$ has its gate 13 connected to the second baseplate part $4_b$ via a conductor $20_b$, and its source 11 connected to the first baseplate part $4_a$ via a conductor 19.

Electrically, therefore, the device $1_k$ is circuited as equivalently diagramed in FIG. 2, gaining the same advantages with the first disclosed device 1. An additional advantage is that the device $1_k$ has a greater latitude of placement of the Si SBD 2 and HEMT 3. Furthermore, separated from the first baseplate part $4_a$, the second baseplate part $4_b$ may be configured for optimal circuit stability and heat radiation.

Figure 19:
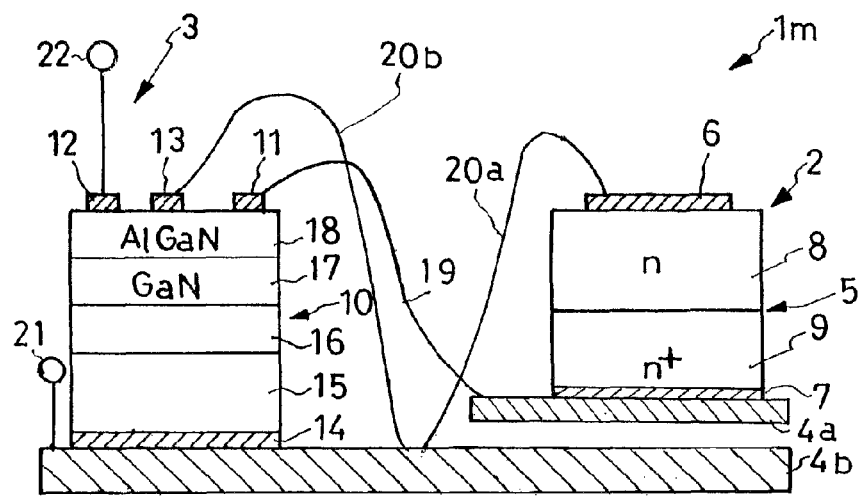
FIG. 19 is a schematic electrical diagram of a further preferred form of composite semiconductor device according to the invention.

Embodiment of FIG. 19

In this composite semiconductor device $1_m$ too, as in the device $1_k$, the Si SBD 2 and HEMT 3 are mounted on separate baseplate parts $4_a$ and $4_b$, respectively. However, the terminal 21 is coupled to the second baseplate part $4_b$ instead of to the anode 6 of the Si SBD 2 as in the FIG. 18 embodiment. All the other details of construction are substantially the same as those of the device 1, FIG. 1.

The anode 6 of the Si SBD 2 of this device $1_m$ is coupled to the second baseplate part $4_b$ via the conductor $20_a$, and so is the gate 13 of the HEMT 3 via the conductor $20_b$. The source 11 of the HEMT 3 is coupled to the first baseplate part $4_a$ via the conductor 19. The second baseplate part $4_b$ is so large compared to the first baseplate part $4_a$ that the latter may be placed upon the former via an insulator, not shown.

This device $1_m$ is also electrically circuited as in FIG. 2 and so gains the same advantages as the first disclosed device 1. An additional advantage of the device $1_m$ is that it is easier to radiate heat than the devices 1 and $1_k$ of FIGS. 1 and 18.

In both devices $1_k$ and $1_f$ of FIGS. 18 and 19, the Si SBD 2 is replaceable by a Si pn-junction diode $2_a$, FIG. 7, or a pin-junction diode. The HEMT 3 of these devices $1_k$ and $1_m$ is also replaceable by the MISFET $3_a$, FIG. 8, MESFET $3_b$, FIG. 10, MISFET $3_c$, FIG. 11, MISFET $3_d$, FIG. 12, or JFET $3_e$, FIG. 13.

Possible Modifications

Notwithstanding the foregoing detailed disclosure it is not desired that the present invention be limited by the exact showings of the drawings or the description thereof. The following is a brief list of possible modifications, alterations or adaptations of the illustrated representative semiconductor devices which are all believed to fall within the purview of the claims annexed hereto:

1. Although the normally-on FET required by the composite semiconductor devices of this invention are shown as the HEMT 3, MISFETs $3_a$ and $3_f$, HEMT-type MISFET $3_b$, MESFET $3_c$, MESFET-type MISFET $3_d$, and JFET $3_e$ and $3_g$, other types of FETs such as a static induction transistor (SIT) could be adopted as well. For lower turn-on resistance, the HEMT-type devices are particularly desirable which utilize as the channel the high-density two-dimensional electron gas layer of AlGaN/GaN heterostructure.

2. The HEMT 3 and other normally-on FETs could be made not from GaN or derivatives thereof but from SiC and other materials having a wider bandgap than silicon. Silicon FETs may be employed instead of the HEMT and so forth in applications where a relatively large chip size poses no problem.

3. A resistor could be interposed between the source S of the HEMT 3 and so forth and the cathode 7 of the Si SBD 2 and so forth.

4. The MOSFET 24, FIG. 6, could be placed on the baseplate 4, FIGS. 1 and 7-13.

5. The n-channel HEMT 3 and other normally-on FETs are replaceable by normally-on p-channel FETs such as p-channel HEMTs, only with the orientation of the Si SBD 2 or some other low-forward-voltage diode reversed from that indicated in FIG. 2. In this case the source of the p-channel FET may be connected to the anode of the Si-SBD 2 or some other diode, and the gate of the p-channel FET connected to the cathode of the Si SBD 2 or some other diode.

6. The MOSFET 24, FIGS. 6, 16 and 17, could be placed on the semiconductor body 50, FIG. 14, or semiconductor body 50$_a$, FIG. 15, for compactness.

What is claimed is:

1. A composite semiconductor device comprising:
   (A) a semiconductor rectifier having an anode and a cathode electrode;
   (B) a unipolar field effect transistor comprising:
      (a) a source electrode coupled to said cathode electrode of said semiconductor rectifier;
      (b) a drain electrode; and
      (c) a gate electrode connected to said anode electrode of said semiconductor rectifier;
      (d) said unipolar field effect transistor being adapted to turn on when a voltage is impressed between said anode electrode of said semiconductor rectifier and said drain electrode of said field effect transistor in a direction to forward bias said semiconductor rectifier;
      (e) a current flowing between said gate electrode and said drain electrode of said field effect transistor when said field effect transistor is on being less than a current flowing between said anode and said cathode electrode of said semiconductor rectifier;
      (f) a voltage withstanding capability between said drain electrode and said gate electrode of said field effect transistor being higher than that of said semiconductor rectifier when a voltage is impressed between said anode electrode of said semiconductor rectifier and said drain electrode of said field effect transistor in a direction to reverse bias said semiconductor rectifier;
   (C) a first terminal electrically connected to said anode electrode of said semiconductor rectifier and said gate electrode of said field effect transistor; and
   (D) a second terminal electrically connected to said drain electrode of said field effect transistor.

2. A composite semiconductor device as defined in claim 1, wherein said semiconductor rectifier is selected from among a silicon pin junction diode, silicon pn-junction diode, and silicon Schottky barrier diode of less voltage withstanding capability than that of known compound semiconductor diodes.

3. A composite semiconductor device as defined in claim 1, wherein said field effect transistor is selected from among a high electron mobility transistor, metal semiconductor field effect transistor, insulated gate field effect transistor, junction gate field effect transistor, and static induction transistor.

4. A composite semiconductor device as defined in claim 1, wherein said field effect transistor is made from a material selected from among nitride semiconductors, silicon carbide, and semiconductors having a wider bandgap than silicon.

5. A composite semiconductor device as defined in claim 1, wherein said field effect transistor has a threshold voltage whose absolute value is less than the maximum voltage capable of being withstood by said semiconductor rectifier.

6. A composite semiconductor device having a Schottky barrier diode and a unipolar field effect transistor in combination, said device comprising:
   (a) a first silicon semiconductor region containing a prescribed conductivity type determinant in a first prescribed concentration;
   (b) a second silicon semiconductor region contiguous to said first silicon semiconductor region, said second silicon semiconductor region containing said prescribed conductivity type determinant in a second prescribed concentration which is higher than said first prescribed concentration;
   (c) a compound semiconductor region contiguous to said second silicon semiconductor region, said compound semiconductor region having a plurality of semiconductor layers for providing the unipolar field effect transistor;
   (d) a Schottky electrode contiguous to said first silicon semiconductor region for providing the Schottky barrier diode;
   (e) a source, a drain and a gate electrode contiguous to said compound semiconductor region for providing the field effect transistor;
   (f) a first conductor for electrically connecting said source electrode of the field effect transistor to said second silicon semiconductor region;
   (g) a second conductor for electrically connecting said gate electrode of the field effect transistor to said Schottky electrode of the Schottky barrier diode;
   (h) said field effect transistor becoming conductive between said source electrode and said drain electrode thereof upon application of a voltage between said Schottky electrode of the Schottky barrier diode and said drain electrode of the field effect transistor in a direction to forward bias a Schottky barrier formed by said Schottky electrode and said first silicon semiconductor region;
   (i) a current flowing between said gate electrode and said drain electrode of the field effect transistor when the field effect transistor is on being less than a current flowing between said Schottky electrode of the Schottky barrier diode and said first conductor;
   (j) a voltage withstanding capability between said drain electrode and said gate electrode of the field effect transistor being higher than that of the Schottky barrier diode when a voltage is impressed between said Schottky electrode of the Schottky barrier diode and said drain electrode of the field effect transistor in a direction to reverse bias the Schottky barrier diode.

7. A composite semiconductor device having a pn- or pin junction diode and a unipolar field effect transistor in combination, said device comprising:
   (a) a first silicon semiconductor region containing a first prescribed conductivity type determinant in a first prescribed concentration;
   (b) a second silicon semiconductor region contiguous to said first silicon semiconductor region;
   (c) a third silicon semiconductor region contiguous to said second silicon semiconductor region, said third silicon semiconductor region containing a second prescribed conductivity type determinant in a second prescribed concentration;
   (d) a compound semiconductor region contiguous to said third silicon semiconductor region, said compound semiconductor region having a plurality of semiconductor layers for providing the unipolar field effect transistor;
   (e) a first electrode in ohmic contact with said first silicon semiconductor region for providing the junction diode;
   (f) a second electrode in ohmic contact with said third silicon semiconductor region for providing the junction diode;
   (g) a source, a drain and gate electrode contiguous to said compound semiconductor region for providing the field effect transistor;

(h) a first conductor for electrically connecting said source electrode of the field effect transistor to said second electrode of the junction diode;
(i) a second conductor for electrically connecting said gate electrode of the field effect transistor to said first electrode of the junction diode;
(j) said field effect transistor becoming conductive between said source electrode and said drain electrode thereof upon application of a voltage between said first electrode of the junction diode and said drain electrode of the field effect transistor in a direction to forward bias the junction diode;
(k) a current flowing between said gate electrode and said drain electrode of the field effect transistor when the field effect transistor is on being less than a current flowing between said first and said second electrode of the junction diode;
(l) a voltage withstanding capability between said drain electrode and said gate electrode of the field effect transistor being higher than that of the junction diode when a voltage is impressed between said first electrode of the junction diode and said drain electrode of the field effect transistor in a direction to reverse bias the junction diode.

8. A compound semiconductor device as defined in claim 7, wherein said second silicon semiconductor region contains either of said first and said second conductivity type determinant in a third prescribed concentration which is less than said first prescribed concentration.

9. A compound semiconductor device having a semiconductor rectifier and a unipolar field effect transistor in combination, said device comprising:
(a) a first semiconductor body having a plurality of semiconductor layers for providing the field effect transistor;
(b) a source, a drain and a gate electrode on one major surface of said first semiconductor body;
(c) a second semiconductor body formed on said first semiconductor body and electrically insulated therefrom, said second semiconductor body having a plurality of semiconductor layers for providing the semiconductor rectifier;
(d) a first and a second electrode on a pair of opposite major surfaces, respectively, of said second semiconductor body for providing the semiconductor rectifier;
(e) a first conductor for electrically connecting said second electrode of the semiconductor rectifier to said source electrode of the field effect transistor;
(f) a second conductor for electrically connecting said gate electrode of the field effect transistor to said first electrode of the semiconductor rectifier;
(g) said field effect transistor becoming conductive between said source electrode and said drain electrode thereof upon application of a voltage between said first electrode of the semiconductor rectifier and said drain electrode of the field effect transistor in a direction to forward bias the semiconductor rectifier;
(h) a current flowing between said gate electrode and said drain electrode of the field effect transistor when the field effect transistor is on being less than a current flowing between said first and said second electrode of the semiconductor rectifier;
(h) a voltage withstanding capability between said drain electrode and said gate electrode of the field effect transistor being higher than that of the semiconductor rectifier when a voltage is impressed between said first electrode of the semiconductor rectifier and said drain electrode of the field effect transistor in a direction to reverse bias the semiconductor rectifier.

10. A composite semiconductor device as defined in claim 9, further comprising an additional transistor formed on said first semiconductor substrate and electrically insulated therefrom, said additional transistor having a third and a fourth electrode electrically connected respectively to said first and said second electrode of the semiconductor rectifier.

11. A compound semiconductor device having a semiconductor rectifier and a unipolar field effect transistor in combination, said device comprising:
(a) a first semiconductor body having a plurality of semiconductor layers for providing the field effect transistor;
(b) a source and a gate electrode on one of a pair of opposite major surfaces of said first semiconductor body;
(c) a drain electrode on the other of the pair of opposite major surfaces of said first semiconductor body;
(d) a second semiconductor body formed on said one major surface of said first semiconductor body and electrically insulated therefrom, said second semiconductor body having a plurality of semiconductor layers for providing the semiconductor rectifier;
(e) a first and a second electrode on a pair of opposite major surfaces, respectively, of said second semiconductor body for providing the semiconductor rectifier;
(f) a first conductor for electrically connecting said second electrode of the semiconductor rectifier to said source electrode of the field effect transistor;
(g) a second conductor for electrically connecting said gate electrode of the field effect transistor to said first electrode of the semiconductor rectifier;
(h) said field effect transistor becoming conductive between said source electrode and said drain electrode thereof upon application of a voltage between said first electrode of the semiconductor rectifier and said drain electrode of the field effect transistor in a direction to forward bias the semiconductor rectifier;
(i) a current flowing between said gate electrode and said drain electrode of the field effect transistor when the field effect transistor is on being less than a current flowing between said first and said second electrode of the semiconductor rectifier;
(j) a voltage withstanding capability between said drain electrode and said gate electrode of the field effect transistor being higher than that of the semiconductor rectifier when a voltage is impressed between said first electrode of the semiconductor rectifier and said drain electrode of the field effect transistor in a direction to reverse bias the semiconductor rectifier.

12. A composite semiconductor device as defined in claim 11, further comprising an additional transistor formed on said first semiconductor substrate and electrically insulated therefrom, said additional transistor having a third and a fourth electrode electrically connected respectively to said first and said second electrode of the semiconductor rectifier.

13. A composite semiconductor device as defined in claim 1, further comprising an additional transistor having a third and a fourth electrode electrically connected respectively to said first and said second electrode of the semiconductor rectifier.

* * * * *